(12) United States Patent
Li et al.

(10) Patent No.: US 8,210,242 B2
(45) Date of Patent: Jul. 3, 2012

(54) HEAT DISSIPATION DEVICE

(75) Inventors: Min Li, Shenzhen (CN); Lei Cao, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 464 days.

(21) Appl. No.: 12/492,142

(22) Filed: Jun. 26, 2009

(65) Prior Publication Data

US 2010/0236755 A1  Sep. 23, 2010

(30) Foreign Application Priority Data

Mar. 19, 2009 (CN) .......................... 2009 1 0300963

(51) Int. Cl.
*H05K 7/20* (2006.01)
(52) U.S. Cl. ................... 165/80.3; 165/104.33; 361/704
(58) Field of Classification Search ............. 165/4, 80.3, 165/185; 361/704, 710
See application file for complete search history.

(56) References Cited

U.S. PATENT DOCUMENTS

| | | | | | |
|---|---|---|---|---|---|
| 3,532,157 | A | * | 10/1970 | Hubble | 165/8 |
| 4,884,631 | A | * | 12/1989 | Rippel | 165/185 |
| 5,513,695 | A | * | 5/1996 | Harting | 165/8 |
| 5,558,155 | A | * | 9/1996 | Ito | 165/80.3 |
| 6,079,481 | A | * | 6/2000 | Lowenstein et al. | 165/10 |
| 6,176,304 | B1 | * | 1/2001 | Lee | 165/185 |
| 6,260,610 | B1 | * | 7/2001 | Biber et al. | 165/80.3 |
| 6,478,082 | B1 | * | 11/2002 | Li | 165/185 |
| 6,615,909 | B2 | * | 9/2003 | Fast | 165/80.3 |
| 6,655,448 | B1 | * | 12/2003 | Lin | 165/80.3 |
| 2005/0022972 | A1 | * | 2/2005 | Cheng-Tung et al. | 165/80.3 |
| 2005/0217824 | A1 | * | 10/2005 | Sandberg et al. | 165/80.3 |

* cited by examiner

*Primary Examiner* — Allen Flanigan
(74) *Attorney, Agent, or Firm* — Altis Law Group, Inc.

(57) ABSTRACT

A heat dissipation device adapted for removing heat from heat-generating components includes a plurality of first fins spaced from each other and connected to the heat-generating components in thermal relationship and a plurality of second fins alternately arranged with the first fins. Each second fin is wave-shaped and has a plurality of flat first engaging portions formed at wave crests thereof and a plurality of flat second engaging portions formed at wave troughs thereof. The first engaging portions are attached to a rear side of one of two first fins neighboring to each second fin. The second engaging portions are attached to a front side of another one of the two neighboring first fins.

14 Claims, 4 Drawing Sheets

HEAT DISSIPATION DEVICE

BACKGROUND

1. Technical Field

The present disclosure relates generally to a heat sink and, more particularly, to a heat sink comprising a plurality of individual fins assembled together for removing heat from a heat-generating electronic component to ambient environment.

2. Description of Related Art

Heat sinks are usually used to remove heat from heat-generating electronic components, such as central processing units (CPUs), light emitting diodes (LEDS) and power transistors, etc., to keep the components in stable operation. A typical heat sink comprises a base for contacting a heat-generating component to absorb heat generated by the heat-generating component and a plurality of parallel planar fins attached to the base by soldering or adhering. The fins are used for dissipating the heat to the ambient environment.

Typically, the heat sink is a parallel fin heat sink, which is fabricated by processes including an extrusion process, a gang sawing process and a bonding process. It is known that a thickness and number of the fins produced by the extrusion process is restricted by the structure limitation and stress loading limitation of a die. If the number of the fins increases, the die fingers become weaker thus easily break off. Therefore, the extrusion process is not suitable for fabricating the high-density fin heat sink. The gang sawing process is performed by cutting off portions of a metal block to produce fins having predetermined thickness, number, depth and gap, which result in a great loss of material. In the bonding process, each fin is individually bonded into a base of the heat sink, which is time-consuming and labor intensive. In addiction, the fins that are not well-bonded into the base are likely to fall and thus be detached from the base.

A current thermal resolution to overcome the problems mentioned above is to provide a composite fin unit having a plurality of individual fins assembled together. The fins each have at least a flange extending perpendicularly from at least an edge thereof. Each flange of the fins is provided with a locking structure thereon. The locking structures of every two adjacent fins engage with each other to assemble the fins together with their flanges oriented in a same direction. The density of the fins can be predetermined by width of the flanges and able to be increased dramatically. Since the flanges of the fins are oriented in the same direction, one of the outmost fins would have its flange projecting nakedly from the fin unit. The naked flange and the locking structures of the fins, however, are in a risk of damaging components surrounding the heat-generating component and hurting an operator during installation.

What is needed is a heat sink which has a plurality of individual fins assembled together to obtain a fin unit which has a high density of fins and is safe in installation and use.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
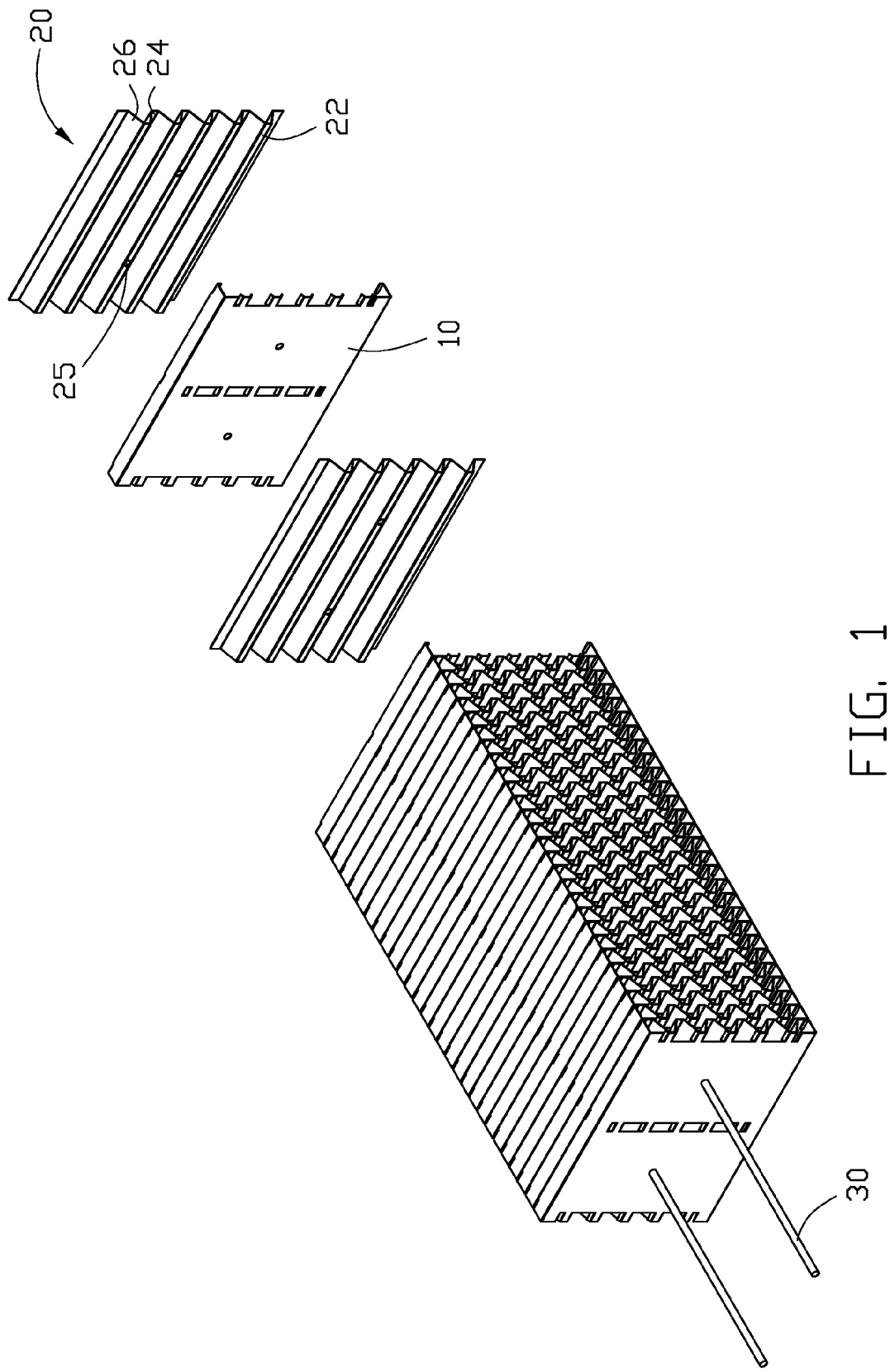
FIG. 1 is an exploded view of a heat dissipation device in accordance with an embodiment of the present disclosure.
Figure 2:
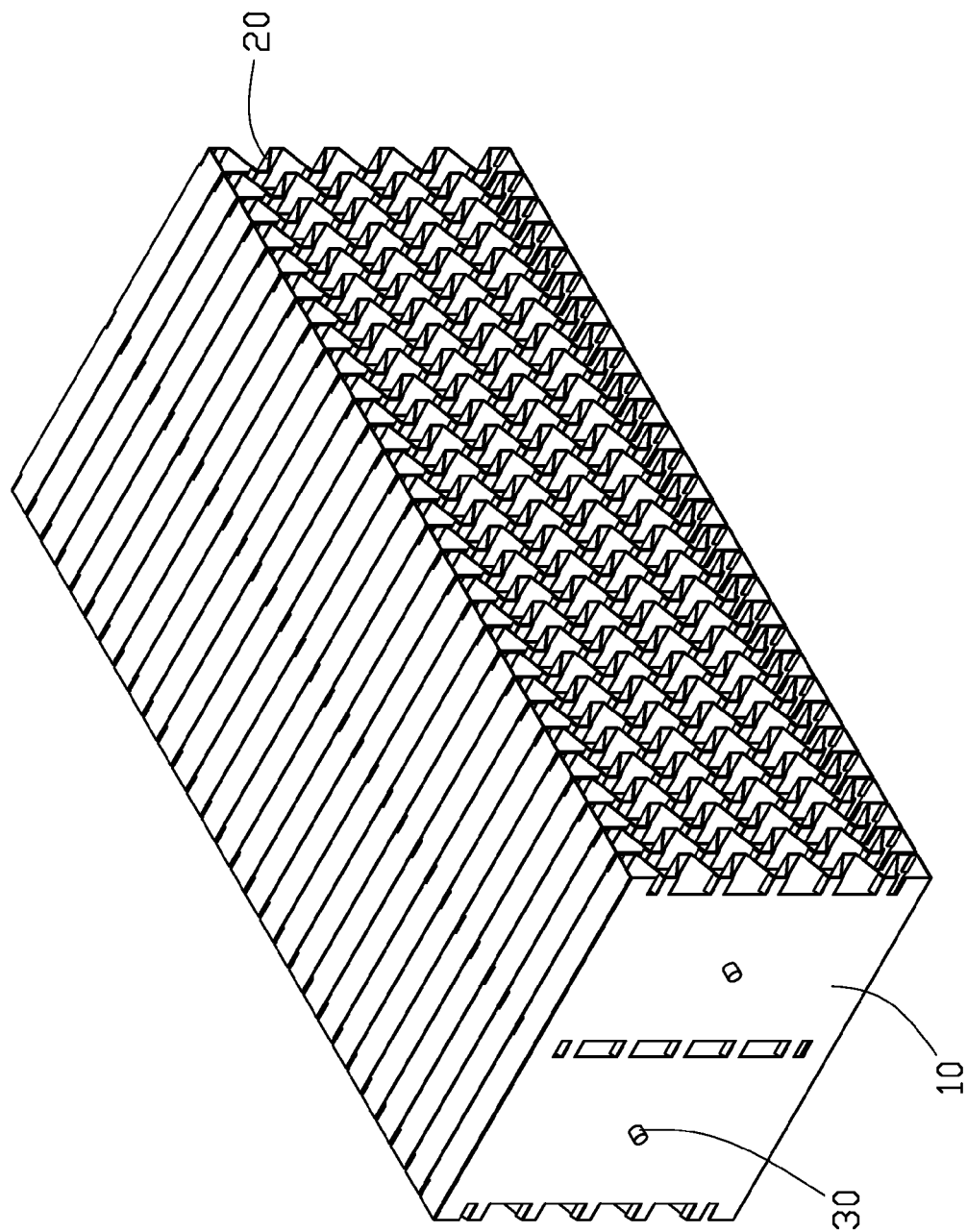
FIG. 2 is an assembled view of the heat dissipation device of FIG. 1.

FIGS. 1-2 illustrate a heat dissipation device in accordance with an embodiment of the present disclosure. The heat dissipation device is adapted for removing heat from heat-generating components such as LED components. The heat dissipation device comprises a plurality of first fins 10 and a plurality of second fins 20 alternately coupled with each other. The first and second fins 10, 20 are integrally made of metallic sheets such as aluminum sheets and copper sheets.

Figure 3:
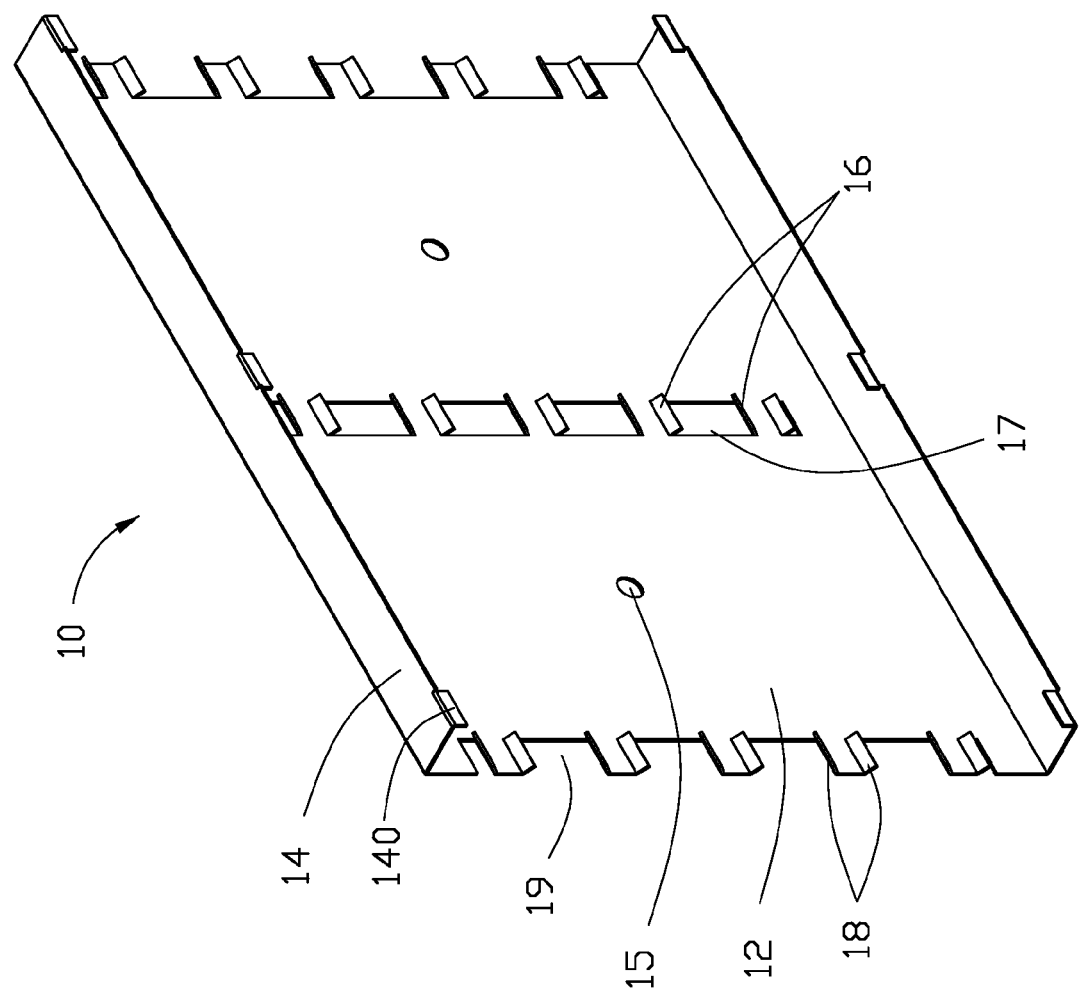
FIG. 3 is an enlarged view of a first fin of the heat dissipation device FIG. 1.

Also referring to FIG. 3, each first fin 10 comprises a rectangular main body 12, two flanges 14 extending perpendicular from upper and lower edges of the main body 12 and a plurality of retaining parts (not labeled) formed on the main body 12 for engaging with a neighboring second fin 20. Two groups of engaging patches 140 extend perpendicularly from two distal of the two flanges 14 of each first fin 10 toward each other, and are attached to the neighboring second fin 20. The engaging patches 140 in each group are spaced from each other and parallel to the main body 12.

The retaining parts of each first fin 10 include a plural pairs of first retaining flakes 16 arranged along a vertical middle line of the first fin 10 and a plural pairs of second retaining flakes 18 arranged along two opposite vertical side edges of the first fin 10. The two retaining flakes 16 (18) of each pair of the first retaining flakes 16 or the second retaining flakes 18 extend obliquely from the main body 12 of the first fin 10 respectively along two directions away from each other. An upper one of each pair of the first retaining flakes 16 or the second retaining flakes 18 extends upwardly and obliquely from the main body 12, while lower one of the first retaining flakes 16 or the second retaining flakes 18 extends downwardly and obliquely from the main body 12.

A plurality of rectangular openings 17 are defined in the main body 12 and located between every two neighboring pairs of the first retaining flakes 16, while a plurality of rectangular cutouts 19 are defined in the main body 12 by recessing inwardly the vertical side of the main body 12 and located between every two neighboring pairs of the second flakes 18. The first or second retaining flakes 16 (18) are respectively extended outwardly from top/bottom edges of the openings 17 or cutouts 19. The retaining flakes 16, 18 and the flanges 14 are located at the same side of the main body 12. Two spaced receiving holes 15 are defined in the main body 12 of each first fin 10 and engagingly receive two fixing poles 30 therein for strengthening the combination of the first and second fins 10, 20 which are alternately stacked on each other.

Figure 4:
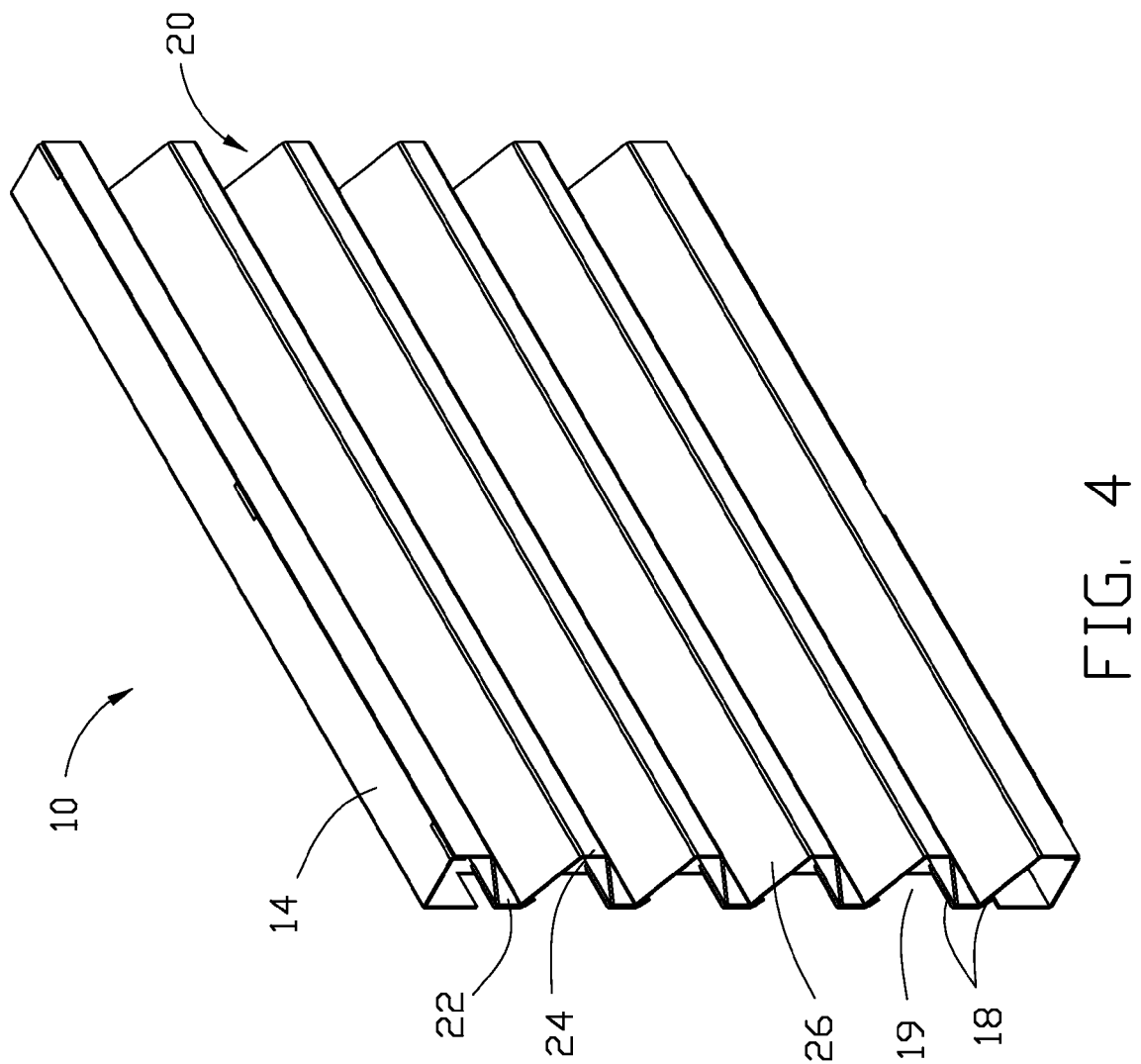
FIG. 4 is an enlarged view of an assembly of the first fin and a second fin of FIG. 1.

Also referring to FIG. 4, each second fin 20 is bent into wave-shaped and comprises a plurality of first elongated engaging portions 22 located at one side thereof, a plurality of second elongated engaging portions 24 located at another side thereof and a plurality of connecting portions 26 respectively connecting adjacent sides of every two neighboring first and second engaging portions 22, 24 together to form a wave-shaped configuration. As the second fin 20 is wave-shaped, the first engaging portions 22 are flat and respectively formed at wave crests of the second fin 20, while the second engaging portions 24 are flat and respectively formed at wave troughs of the second fin 20. The first engaging portions 22 parallel to each other are spaced from each other with a constant distance and coplanar to form a first face, while the second engaging portions 24 parallel to each other are spaced from each other with a constant distance and coplanar to form a second face parallel to and separated from the first face.

Each first engaging portion 22 is corresponding to a middle of two neighboring second portions 24. Each connecting portion 26 is extended obliquely from a long side edge of a first engaging portion 22 and connected to an adjacent long side of a second engaging portion 24 neighboring the first engaging portion 22. Two second engaging portions 24 are respectively located at upmost and lowest positions of the second fin 20 for engaging with the retaining patches 140 of the first fin 10. Two spaced receiving holes 25 corresponding to the receiving holes 15 of the first fins 10 are defined in a middle one of first engaging portions 22 of each second fin 20 and engagingly receive the two fixing poles 30 therein for strengthening the combination of the first and second fins 10, 20.

In assembly of the heat dissipation device, the fist and second fins 10, 20 are alternately assembled together. The first engaging portions 22 of each second fin 20 are attached to a rear side of a first fin 10 in front of the second fin 20 and located between every pair of first and second retaining flakes 16, 18. The retaining flanks 16 (18) of each pair of the first and second retaining flakes 16, 18 are intimately engaged with two connecting portions 26 extending obliquely from two opposite long sides of a corresponding first engaging portion 22. The second engaging portions 24 of the second fin 20 are attached to a front side of a first fin 10 in rear of the second fin 20 and located over the corresponding openings 17 and cutouts 19 of the rear first fin 10. The retaining patches 140 of the front first fin 10 are rested on front sides of the upmost and lowest second engaging portions 24 of the second fin 20. The two fixing poles 30 are respectively received in the receiving holes 15, 25 of the first and second fins 10, 20 to further securely assemble the first and second fins 10, 20 together. Top surfaces of the upper flanges 14 of the first fins 10 and top edges of the second fins 20 are coplanar and define a top surface of the heat dissipation device, while bottom surfaces of the lower flanges 14 of the first fins 10 and bottom edges of the second fins 20 are coplanar and define a bottom surface of the heat dissipation device.

In use of the heat dissipation device, the heat-generating components can be directly connected the top or bottom surface of the heat dissipation device in a thermal relationship. Heat generated by the heat-generating components is adsorbed by the upper or lower flanges 140 of the first fins 10 and conducted to the first and second fins 10, 20 to dissipate into ambient environment. The wave-shaped configuration of the second fins 20 can greatly increase contacting area with ambient air, therefore enhancing the heat transferring capacity of the heat dissipation device. The wave-shaped configuration of the second fins 20 also make each second fin 20 contact with the two neighboring first fin 10 simultaneously with a large contacting area, thus obviously strengthening jointing strength between the first and second fins 10, 20.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A heat dissipation device adapted for removing heat from heat-generating components, comprising:
   a plurality of first fins spaced from each other and adapted for connecting to the heat-generating components in thermal relationship; and
   a plurality of second fins alternately arranged with the first fins, each second fin being wave-shaped and having a plurality of wave crests attached to a rear side of one of two first fins neighboring to each second fin and a plurality of wave troughs attached to a front side of another one of the two first fins;
   wherein a plurality of flat first engaging portions are formed at the wave crests and attached to a front one of the two first fins, while a plurality of flat second engaging portions are formed at the wave troughs and attached to a rear one of the two first fins; and
   wherein two flanges are extended perpendicularly from upper and lower edges of each first fin and have two groups of engaging patches extending perpendicularly from two distal ends of the two flanges toward each other and attached to front sides of two second engaging portions of a neighboring second fin.

2. The heat dissipation device as claimed in claim 1, wherein the first and second engaging portions are elongated and parallel to each other.

3. The heat dissipation device as claimed in claim 1, wherein each second fin further comprises a plurality of connecting portions which are extended obliquely and outwardly from upper and lower side edges of the first engaging portions and connected to the neighboring second engaging portions, to thus respectively connect neighboring first and second engaging portions together.

4. The heat dissipation device as claimed in claim 3, wherein a plurality of retaining parts are formed on the rear side of the front one of the two first fins and engage with the connecting portions of each second fin.

5. The heat dissipation device as claimed in claim 4, wherein the retaining parts includes a plural pairs of retaining flakes extending obliquely and outwardly from the rear side of the front one of the two first fins, wherein an upper one of each pair of the retaining flakes extending upwardly and obliquely from the rear side of the front one of the two first fins, while a lower one of each pair of the retaining flakes extending downwardly and obliquely from the rear side of the front one of two first fins.

6. The heat dissipation device as claimed in claim 5, wherein the first engaging portions are respectively located between every pair of retaining flakes which are engaged with the connecting portions.

7. The heat dissipation device as claimed in claim 5, wherein the retaining flakes include a plural pairs of first retaining flakes spaced from each other and arranged along a middle vertical line of each first fin and a plural pairs of second retaining flakes spaced from each other and arranged along two opposite vertical sides of each first fin.

8. The heat dissipation device as claimed in claim 7, wherein the front one of the two first fins defines a plurality of opening therein located between every two neighboring pairs of the first retaining flakes and a plurality of cutouts recessing from the two opposite vertical sides thereof and located between every two neighboring pairs of the second retaining flakes.

9. The heat dissipation device as claimed in claim 8, wherein the second engaging portions of each second fin are attached to a front side of the rear one of the first fins and span over the openings and the cutouts of the rear one of the first fins.

10. A heat dissipation device adapted for removing heat from heat-generating components, comprising:
    a plurality of first fins spaced from each other and adapted for connecting the heat-generating components in thermal relationship; and
    a plurality of second fins alternately arranged with the first fins, each second fin being wave-shaped and having a plurality of flat first engaging portions formed at wave crests thereof and a plurality of flat second engaging portions formed at wave troughs thereof;
    wherein the first engaging portions are attached to a rear side of one of two first fins neighboring to each second fin while the second engaging portions are attached to a front side of another one of the two neighboring first fins;

wherein each second fin further comprises a plurality of connecting portions which are extended obliquely and outwardly from opposite side edges of the first engaging portions and connected to the neighboring second engaging portions, to thus respectively connect neighboring first and second engaging portions together; and wherein a plurality of retaining parts are formed on the rear side of one the two first fins and engage with the connecting portions of each second fin.

11. The heat dissipation device as claimed in claim 10, wherein the first and second engaging portions are elongated and parallel to each other.

12. The heat dissipation device as claimed in claim 10, wherein the retaining parts includes a plurality pair of retaining flakes extending outwardly and obliquely from the rear side of the one of the two first fins, and wherein an upper one of each pair of the retaining flakes extends upwardly and obliquely from the rear side of the one the two first fins, while a lower one of each pair of the retaining flakes extends downwardly and obliquely from the rear side of the one of the two first fins.

13. The heat dissipation device as claimed in claim 12, wherein the first engaging portions are respectively located between every pair of retaining flakes which are engaged with the connecting portions.

14. The heat dissipation device as claimed in claim 10, further comprising at least one fixing pole extending through the first and second fins.

* * * * *